(12) United States Patent
Redzheb et al.

(10) Patent No.: US 10,553,480 B2
(45) Date of Patent: Feb. 4, 2020

(54) SELECTIVE DEPOSITION OF DIELECTRIC MATERIALS

(71) Applicant: IMEC VZW, Leuven (BE)

(72) Inventors: Murad Redzheb, Leuven (BE); Silvia Armini, Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/970,636

(22) Filed: May 3, 2018

(65) Prior Publication Data
US 2018/0323102 A1   Nov. 8, 2018

(30) Foreign Application Priority Data

May 4, 2017 (EP) ..................................... 17169473

(51) Int. Cl.
| | | |
|---|---|---|
| *H01L 21/768* | (2006.01) | |
| *H01L 21/02* | (2006.01) | |
| *H01L 21/321* | (2006.01) | |
| *H01L 23/522* | (2006.01) | |
| *H01L 23/532* | (2006.01) | |

(52) U.S. Cl.
CPC .. *H01L 21/76835* (2013.01); *H01L 21/02299* (2013.01); *H01L 21/321* (2013.01); *H01L 21/76829* (2013.01); *H01L 21/76897* (2013.01); *H01L 23/5226* (2013.01); *H01L 23/53238* (2013.01); *H01L 23/53295* (2013.01)

(58) Field of Classification Search
CPC ......... H01L 21/76835; H01L 21/76897; H01L 23/5226; H01L 23/53238; H01L 23/53295; H01L 21/02126; H01L 21/02203; H01L 21/02216; H01L 21/02282; H01L 21/02299; H01L 21/76829; H01L 21/306; H01L 21/3105; H01L 21/321
See application file for complete search history.

(56) References Cited

U.S. PATENT DOCUMENTS

| | | |
|---|---|---|
| 7,749,881 B2 | 7/2010 | Lazovsky et al. |
| 7,790,631 B2 | 9/2010 | Sharma et al. |
| (Continued) | | |

OTHER PUBLICATIONS

Hashemi, Fatemeh Sadat Minaye et al., "Selective Deposition of Dielectrics: Limits and Advantages of Alkanethiol Blocking Agents on Metal-Dielectric Patters", ACS Applied Materials & Interfaces, vol. 8 , Nov. 7, 2016, pp. 33264-33272.
(Continued)

*Primary Examiner* — Ahmed N Sefer
(74) *Attorney, Agent, or Firm* — McDonnell Boehnen Hulbert & Berghoff LLP

(57) ABSTRACT

The present disclosure relates to a method for selectively forming a dielectric material on a first area of a top surface of a substrate. In an embodiment, the method involves providing the substrate including the top surface, the top surface including the first area and a second area, the first area having a hydrophilicity characterized by a water contact angle of at least 45° and the second area having a hydrophilicity characterized by a water contact angle of less than 40°. The method also involves providing a precursor aqueous solution on the substrate, the precursor aqueous solution including: a solvent, a dielectric material precursor, a catalyst for forming a dielectric material from the dielectric material precursor, and an ionic surfactant. Further, the method involves removing the solvent.

20 Claims, 12 Drawing Sheets

(56) References Cited

U.S. PATENT DOCUMENTS

| | | | |
|---|---|---|---|
| 7,902,064 B1 | 3/2011 | Chiang et al. | |
| 7,932,186 B2 | 4/2011 | Chang et al. | |
| 9,087,999 B2 | 7/2015 | Newsome | |
| 2006/0115982 A1* | 6/2006 | Morisue | H01L 21/288 438/638 |
| 2010/0122711 A1* | 5/2010 | Ryan | C11D 7/08 134/2 |
| 2014/0183516 A1* | 7/2014 | Newsome | H01L 51/105 257/40 |
| 2014/0231998 A1 | 8/2014 | Kuo et al. | |
| 2015/0357220 A1* | 12/2015 | Momikura | H01L 21/6875 361/234 |
| 2018/0043283 A1* | 2/2018 | Tao | B01D 15/10 |

OTHER PUBLICATIONS

Hozumi, Atsushi et al., "Fabrication of Micropatterned Mesoporous Silica Film on a Flexible Polymer Substrate Through Pattern Transfer and Subsequent Photocalcination", Journal of Vacuum Science and Technology: Part A., vol. 24, No. 4, Jul./Aug. 2006, pp. 1494-1499.

Yang, Hong et al., "Mesoporous Silica With Micrometer-Scale Designs", Advanced Materials, vol. 9, No. 10, Aug. 8, 1997, pp. 811-814.

European Search Report, European Patent Application No. 17169473.0, dated Oct. 17, 2017, 10 pages.

* cited by examiner

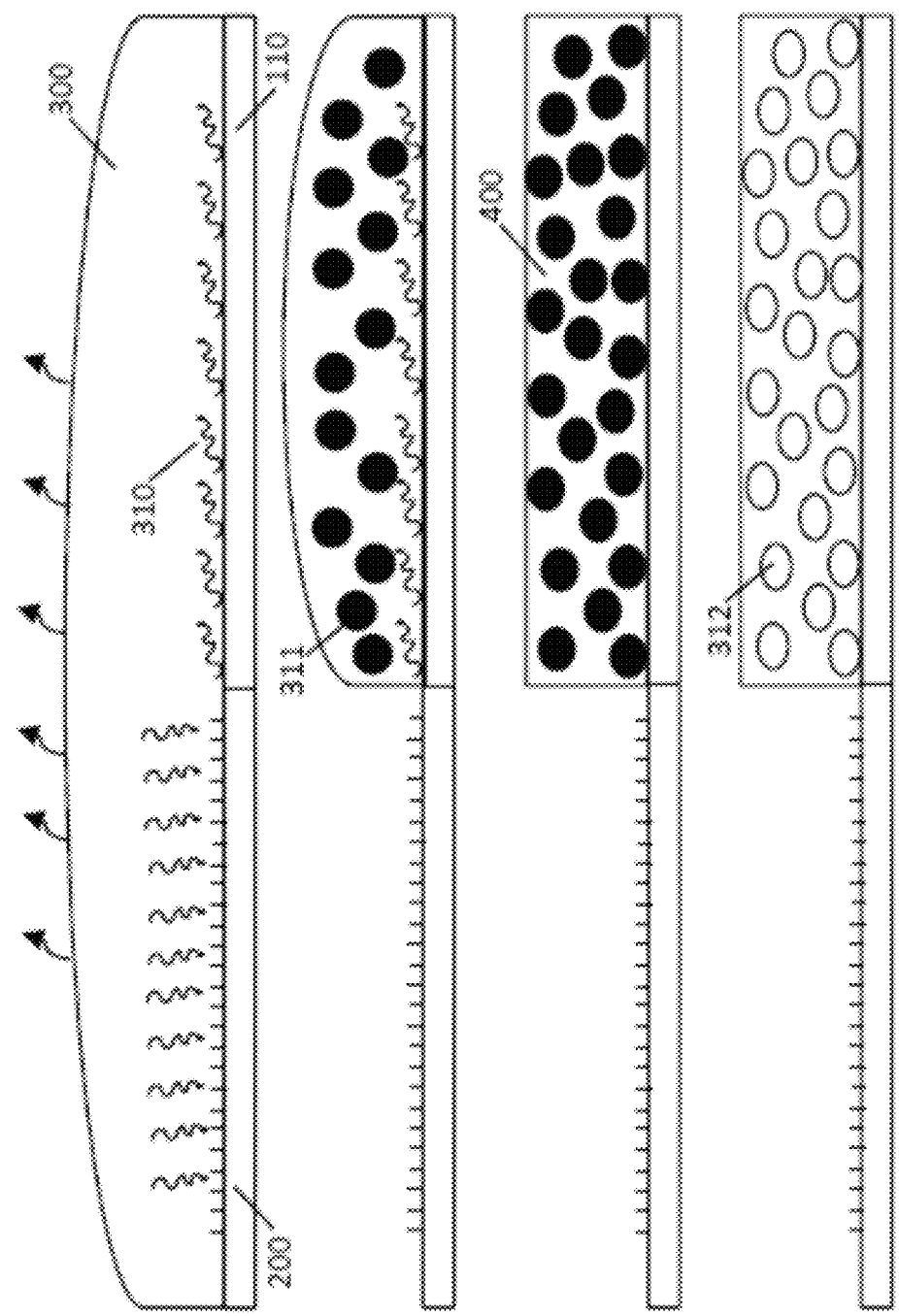

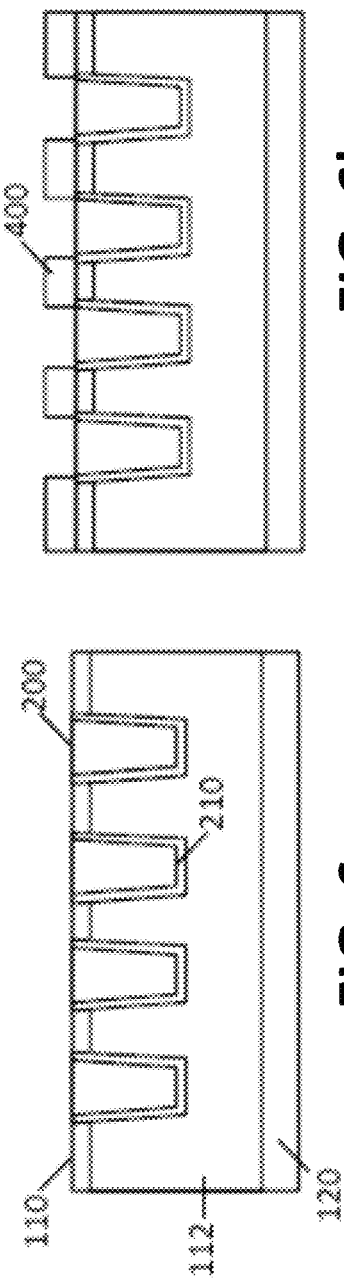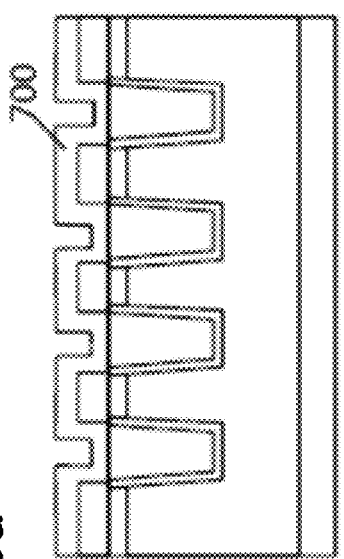

SELECTIVE DEPOSITION OF DIELECTRIC MATERIALS

CROSS-REFERENCE TO RELATED APPLICATIONS

The present application is a non-provisional patent application claiming priority to EP 17169473.0, filed on May 4, 2017, the contents of which are hereby incorporated by reference.

FIELD OF THE DISCLOSURE

The present disclosure relates to the field of selective material deposition and in particular to the formation of dielectric materials, particularly low-k dielectric materials, selectively on a particular area of a substrate during the formation of a semiconductor device.

BACKGROUND

Over the last decades, the dimensions of micro-electronic devices have been continuously scaled down, leading to exponential gains in computational power and reduction in production cost. However, as the device dimensions are shrinking to the order of 10 nm, further scaling brings significant challenges to optical lithography. These challenges include not only the issue of resolution, but additionally the accurate pattern placement, i.e., the alignment of features to already existing features on the substrate, is emerging as a major concern for the conventional "top-down" patterning techniques.

An alternative approach that is gaining increasing importance is based on "bottom-up" strategies for patterning. Examples include self-aligned vias, self-aligned double and multiple patterning, directed self-assembly (DSA), and area selective deposition. In area selective deposition, differences in surface reactivity are exploited to deposit material only according to predefined patterns, while the rest of the substrate remains unaffected. This can enable self-aligned processing, as the selectively grown film is aligned to a pre-existing pattern.

The approaches for area selective deposition that have previously been explored typically rely on the grafting of the area where deposition should be prevented with self-assembled monolayers (SAMs) or macromolecules combined with atomic layer deposition (ALD). This is for instance the case in Hashemi et al. (ACS applied materials & interfaces, vol. 8, issue 48, pages 33264-33272). In ALD, a thin film is deposited on a substrate by self-limiting surface reactions of gas phase precursors. The deposition principle, based exclusively on surface reactions, provides an excellent opportunity to exploit area selective deposition. However, thermal ALD processes, which are compatible with the selectivity concept, are mostly limited to the deposition of metal oxides or metal nitrides, which are high-k materials. In addition, the ALD process conditions, such as temperature, precursors, and oxidizing environment, can typically have a detrimental effect on the other materials comprised in the substrate, such as on any organic materials.

There is thus still a need for methods for area selective deposition that address some or all of the issues described above.

SUMMARY

Disclosed herein are methods for forming dielectric materials selectively on a particular area of a substrate, and for providing structures obtained therefrom.

In an embodiment, the dielectric materials can be low-k materials. As explained above, current methods are typically limited to high-k materials.

In an embodiment, the process conditions, such as temperature and chemical environment, can be compatible with other materials eventually comprised in the substrate, e.g., organic materials and/or porous materials.

In an embodiment, the area selective deposition is self-aligned to features on the substrate surface.

In an embodiment, the methods disclosed herein can be used in a process for forming self-aligned vias, e.g., vias for forming electrical connections in a semiconductor device.

In an embodiment, the methods disclosed herein do not require expensive coating equipment as they can be solution based. In an embodiment, the methods disclosed herein can be based on solution processing techniques, which can be used in fabrication plants.

In an embodiment, the methods disclosed herein do not require a masking step of the area one does not want to cover with the dielectric material.

The above objectives can be accomplished by the methods and structures disclosed herein.

In a first aspect, the present disclosure relates to a method for forming a dielectric material selectively on a first area of a top surface of a substrate, the method including: providing the substrate including the top surface, the top surface including the first area and a second area, the first area having a hydrophilicity characterized by a water contact angle of at least 45° (i.e., 45° or more) and the second area having a hydrophilicity characterized by a water contact angle of less than 40°. The method further includes providing a precursor aqueous solution on the substrate, the precursor aqueous solution including: a solvent, a dielectric material precursor, a catalyst for forming a dielectric material from the dielectric material precursor, and an ionic surfactant. Further, the method includes removing the solvent.

In a second aspect, the present disclosure relates to a semiconductor structure including: (i) a substrate including a top surface, the top surface including a first area and a second area, the second area having a hydrophilicity characterized by a water contact angle of less than 40° and the first area having a hydrophilicity characterized by a water contact angle of 45° or more; and (ii) a dielectric material present at least on the first area.

In an embodiment, the dielectric material may be a low-k material, such as a low-k material including silica or an organosilica. In the first aspect, to form a low-k material, the precursor aqueous solution, once provided on the substrate, can be heated in such a way as to decompose the ionic surfactant.

Particular aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

FIGS. 4a, 4b, 4c, 4d show a schematic representation of different stages in the formation of a dielectric material selectively on a specific area, in accordance with an exemplary embodiment.

FIGS. 6a, 6b, 6c show another schematic representation of different stages in the formation of a dielectric material selectively on a particular area as preparation to a subsequent formation of a via, in accordance with an exemplary embodiment.

Figure 1:
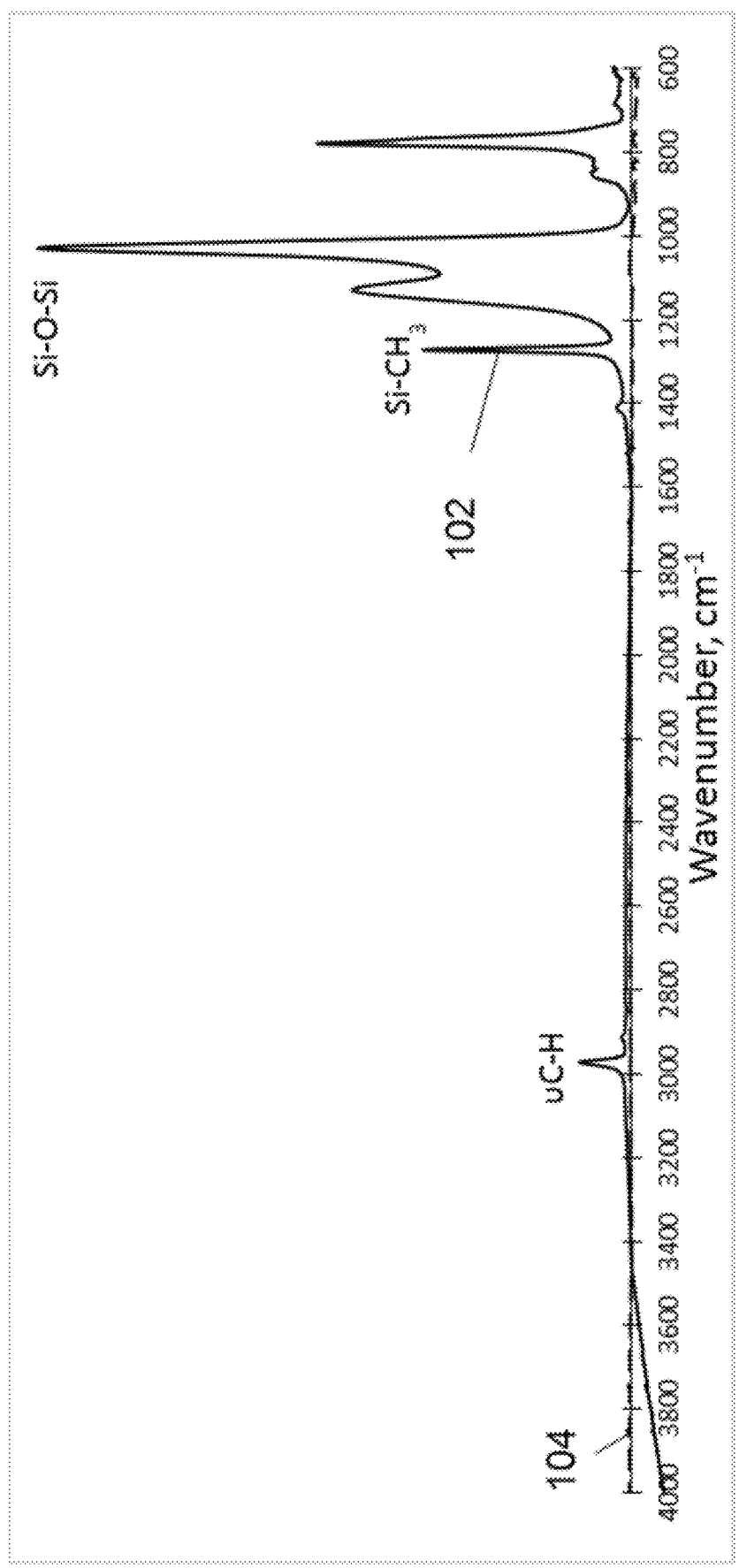
FIG. 1 shows Fourier transformed infrared spectra (FTIR), in accordance with an exemplary embodiment.

In the different figures, the same reference signs refer to the same or analogous elements.

DETAILED DESCRIPTION

In the following, in the description of exemplary embodiments, various features may be grouped together in a single embodiment, figure, or description thereof for the purpose of streamlining the disclosure and aiding in the understanding of one or more of the various aspects. This is however not to be interpreted as the disclosure requiring more features than the ones expressly recited in the main claim. Furthermore, combinations of features of different embodiments are meant to be within the scope of the disclosure, as would be clearly understood by those skilled in the art. Additionally, in other instances, well-known methods, structures and techniques have not been shown in detail in order not to obscure the conciseness of the description.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, over, under, and the like in the description and the claims are used for descriptive purposes and not necessarily for describing relative positions. It is to be understood that the terms so used are interchangeable with their antonyms under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Reference will be made to transistors. These are devices having a first main electrode such as a drain, a second main electrode such as a source, and a control electrode such as a gate for controlling the flow of electrical charges between the first and second main electrodes.

The following terms are provided solely to aid in the understanding of the disclosure.

As used herein, the hydrophilicity of an area may be expressed through the water contact angle of that area, where a lower water contact angle corresponds to a higher hydrophilicity, and where a higher contact angle corresponds to a lower hydrophilicity. The water contact angles can be obtained by a static contact angle measurement at room temperature of a droplet of water, with a volume in the range of 1-3 μl, on the area, using, for example, an optical tensiometer (e.g., Theta™ from Attension™), and fitting a Young Laplace equation around the droplet.

When the contact angle of a covered surface is discussed herein (e.g., when the contact angle of a first area is discussed in the second aspect, said first area being covered by a dielectric material and therefore not being directly accessible to a water droplet), its water contact angle may be evaluated on an uncovered surface determined by reverse engineering to be of the same nature as the covered surface before it was covered.

As used herein, a low-k material is a material having a dielectric constant (i.e., relative permittivity) below that of $SiO_2$, i.e., a dielectric constant of 3.9 or below.

In a first aspect, the present disclosure relates to a method for forming a dielectric ($\varepsilon$) material selectively on a first area of a top surface of a substrate, the method comprising: providing the substrate comprising the top surface, the top surface comprising the first area and a second area, the first area having a hydrophilicity characterized by a water contact angle $\theta_1$ of 45° or more and the second area having a hydrophilicity characterized by a water contact angle $\theta_2$ of less than 40°. The method further comprises providing a precursor aqueous solution on the substrate, the precursor aqueous solution comprising: a solvent, a dielectric ($\varepsilon$) material precursor, a catalyst for forming a dielectric material from the dielectric ($\varepsilon$) material precursor, and an ionic surfactant. The method further comprises removing (e.g., evaporating) the solvent.

Figure 7:
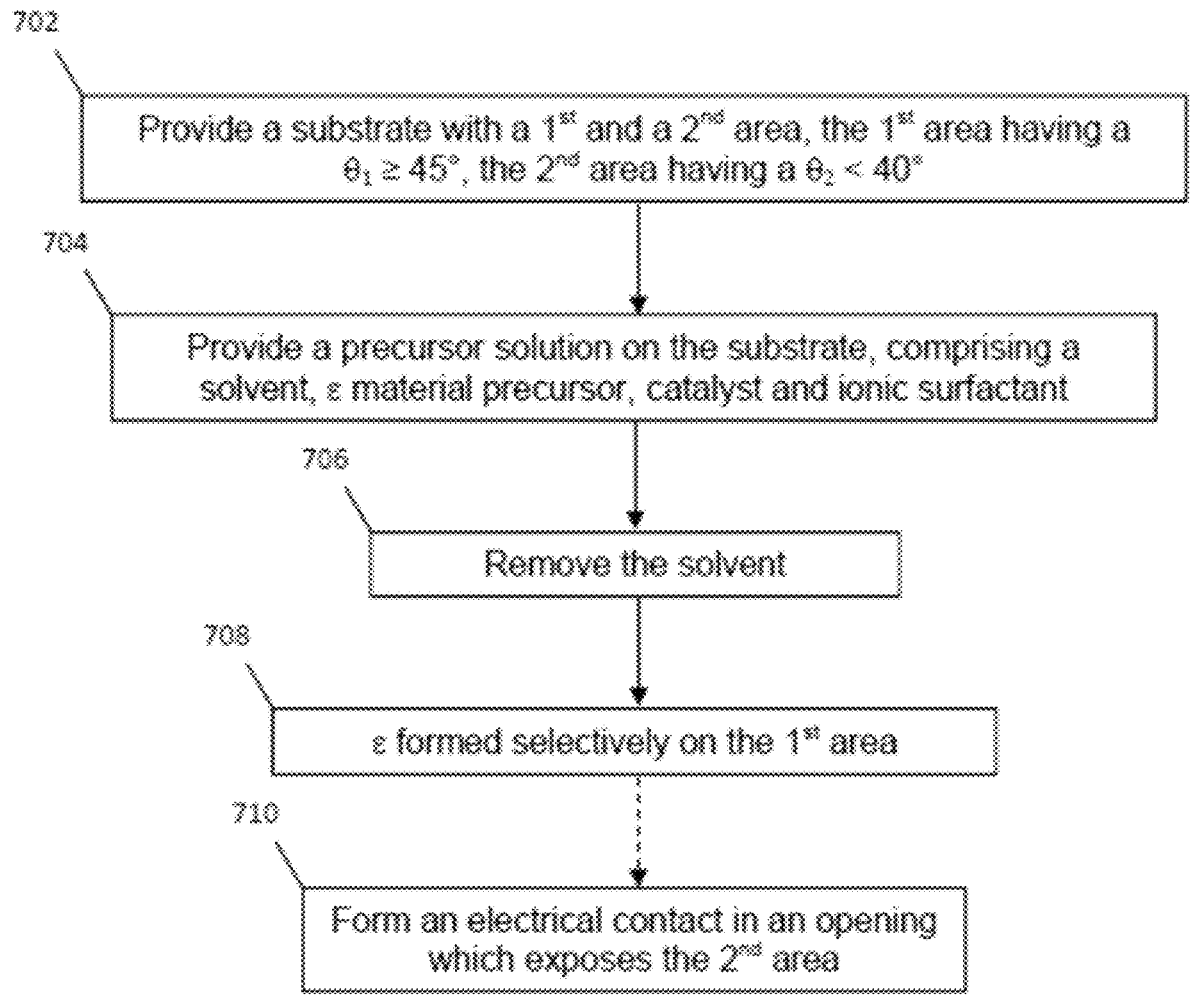
FIG. 7 shows a flowchart of a method, in accordance with an exemplary embodiment.

A flow chart of this method, comprising further optional steps, is depicted in FIG. 7.

In the presence of an ionic surfactant, a dielectric material may not stably form onto an area with a high hydrophilicity. The same effect may not be observed when the surfactant is a non-ionic surfactant. Furthermore, this effect can be exploited to selectively (e.g., area selectively) form the dielectric material only on an area having a lower hydrophilicity.

The solvent comprises water. The water in the precursor aqueous solution is considered as part of the solvent but can originate from the addition of the catalyst and/or the ionic surfactant, or both in the form of aqueous solution(s). In an embodiment, the solvent can be in one phase and therefore can be composed of mutually miscible solvents in the proportion they are used. Since the precursor solution is an aqueous solution, the solvent can be composed of water-miscible solvents in the proportion that they are used.

In embodiments, forming the dielectric material on the first area may comprise the dielectric material remaining in contact with (e.g., not dewetting from) the first area for at least 6 hours, or at least 24 hours, or at least 1 month, or at least 1 year. It should be appreciated that under particular circumstances, such as when the precursor aqueous solution is applied by spin coating at a high spinning speed, the dielectric material can temporarily be present on an area with high hydrophilicity ($\theta<40°$), however, the dielectric material subsequently spontaneously dewets from said area. Such a temporary presence of the dielectric material on the area is thus not considered to be a formation of the dielectric material on the area.

The substrate may typically be any substrate, such as a semiconductor substrate (e.g., comprising a Si wafer). Further, in so far that the top surface of the substrate comprises a first area and a second area, the first area having a hydrophilicity being characterized by a water contact angle of 45° or more and the second area having a hydrophilicity characterized by a water contact angle of less than 40°. In some embodiments, the first area may comprise a further dielectric material, such as a low-k material or $SiO_2$. And in some embodiments, the second area may comprise a metal, such as Cu.

Step "a" (shown in FIG. 7 as step 702) of providing the substrate may comprise a step "a1" of providing a substrate having a first area and a second area, followed by a step "a2" of surface engineering the first and/or the second area such that the first area has a water contact angle of 45° or more and the second area has a water contact angle of less than 40°. Surface engineering can involve changing the topography of the surface (e.g., roughening the surface to make it less hydrophilic), chemically functionalizing the surface (e.g., with silanes or thiols), treating it with a plasma (e.g., with an oxygen-containing plasma to make it more hydrophilic), or any other suitable surface modification. In embodiments where the first area comprises a further dielectric material, at least a top surface of the further dielectric material may be reacted with a hydrophobic silane, such as a trialkoxyalkylsilane (e.g., trimethoxymethylsilane). Silylation of the dielectric material with a hydrophobic silane, or reacting to another hydrophobic material, can lower the hydrophilicity of the first area. In embodiments, the first area may have a hydrophilicity characterized by a water contact angle of at least 50°, or at least 60°, or at least 80°.

In embodiments where the second area comprises a metal, at least a top surface of the metal may be reduced, perhaps using a hydrogen plasma or an acid (e.g., citric acid). In embodiments, the second area may comprise a self-assembled monolayer having a polar end-group, e.g., a thiol having a polar end-group such as an —OH group. The self-assembled monolayer may, for example, be assembled on a top surface of the metal. Reducing at least the top surface of the metal and/or assembling a self-assembled monolayer having a polar end-group on said top surface can increase the hydrophilicity of the second area.

In some embodiments, the dielectric material may be a low-k material. In embodiments, the low-k material may comprise a silica, such as a sol-gel derived surfactant-templated silica, or an organosilica. In embodiments, the dielectric constant of the low-k material may be 3.9 or less, or 3.5 or less, or 3.0 or less, or 2.5 or less. Typically, the dielectric constant of the low-k material may be 2.0 or more.

In embodiments, the dielectric material precursor may be a single precursor or a mixture of precursors. In embodiments, the dielectric material precursor may be selected from the list consisting of alkoxy alkyl silanes and alkoxy silanes. Alkoxy alkyl silanes can be non-bridged (RSi(OR')$_3$), carbon bridged ((OR')$_3$—Si—R—Si—(OR')$_3$) or cyclic carbon bridged (e.g., 1,1,3,3,5,5-hexaethoxy-1,3,5-trisilacyclohexane). In an embodiment, 50% or more or 60% or more of the precursors used (e.g., in a mixture of precursors) are alkoxy alkyl silanes. In other embodiments, the dielectric material precursor may be selected from the list consisting of triethoxymethylsilane, bis(triethoxysilyl)methane, bis(triethoxysilyl)ethane, 1,1,3,3,5,5-hexaethoxy-1,3,5-trisilacyclohexane, and tetraethyl orthosilicate. Tetraethyl orthosilicate can be used as a mixture with an alkoxy alkyl silane. In such a mixture, tetraethyl orthosilicate can be used at 50 mol % or less, or at 40 mol % or less. In an implementation, 50 % or more, or 60 % or more, of the precursors used (e.g., in a mixture of precursors) is triethoxymethylsilane.

In embodiments, the catalyst may be an acid or alkaline based catalyst. In some embodiments, the catalyst may be an acid based catalyst. The acid may for example be selected from the list of inorganic acids, such as hydrochloric acid, hydrofluoric acid, nitric acid, sulfuric acid or phosphoric acid. Alternatively, the acid may for example be selected from the list of organic acids, such as formic acid, acetic acid, propionic acid, butanoic acid, valeric acid, oxalic acid, maleic acid, malonic acid, butyric acid, sulfonic acid, phthalic acid, fumaric acid, citric acid or tartaric acid. In some embodiments, the acid may be a strong inorganic acid. In an implementation, the acid may be hydrochloric acid. Within examples, acid-based catalysts may be more suited for forming dielectric films, whereas alkaline based catalysts may be more suited for forming dielectric particles. In an embodiment, when a strong acid is used, its normality in the final solution (e.g., matrix solution+template solution, see infra) may be from $2.10^{-5}$ N to $7.10^{-2}$ N, or from $2.10^{-5}$ N to $5.10^{-2}$ N, or from $2.10^{-5}$ N to $10^{-3}$ N, or from $2.10^{-5}$ N to $10^{-4}$ N, or from $2.10^{-5}$ N to $7.10^{-5}$ N. For instance, in the examples, a selectivity can be observed for a concentration in HCl in the final solution of about $4.7.10^{-5}$. When a weak acid is used, its concentration can be adapted to arrive at a pH equivalent to the pH arrived at for the concentration values in strong acid given above.

In embodiments, the solvent may comprise one or more solvents selected from water, alcohols (e.g., methanol, ethanol, 1-methoxy-2-propanol), esters (e.g., 1-methoxy-2-propyl acetate), aromatics (e.g., toluene, xylene), ethers (e.g., tetrahydrofuran or glycol ethers such as dipropylene glycol methyl ether), ketones (e.g., acetone), and haloalkanes (e.g., dichloromethane, trichloromethane). In some embodiments, the solvent may comprise water. Water enables hydrolyzing alkoxy groups of a dielectric material precursor. In embodiments, the solvent may comprise one or more of ethanol, 1-methoxy-2-propanol and/or water. In embodiments, the solvent may comprise a mixture of ethanol, 1-methoxy-2-propanol, and water.

In embodiments, the amount of solvent in the final solution (e.g., matrix solution+template solution) may be from 83 to 97 vol %, or from 85 to 95 vol %, or from 87 to 93 vol %, or from 88 to 92 vol %.

In embodiments, the amount of water in the solvent of the final solution (e.g., matrix solution+template solution) may be from 7 to 13 vol %, or from 8 to 12 vol %, or from 9 to 11 vol %.

In embodiments, the amount of low boiling point solvent (bp<100° C.) in the solvent of the final solution (e.g., matrix solution+template solution) may be at most 25%, or at most 20%, or at most 19%.

In embodiments, the amount of high boiling point solvent (bp>100° C.) in the solvent of the final solution (e.g., matrix solution+template solution) may be at least 65%, or at least 70%, or at least 71%. Note that the higher the ratio high boiling point solvent/low boiling point solvent, the higher the selectivity. The amount of low boiling point solvent therefore can be kept as small as necessary for solubilizing purposes.

As used herein and unless provided otherwise, a high boiling point solvent has a boiling point of more than 100° C., or at least 110° C., or at least 120° C.

In some embodiments, the ionic surfactant may be a cationic surfactant, such as cetyltrimethylammonium chloride, cetyltrimethylammonium bromide, domiphen bromide, octadecyltrimethylammonium chloride, cetylpyridinium chloride, N-dodecyl pyridinium chloride, or a cationic gemini surfactant. In other embodiments, the ionic surfactant may be an anionic surfactant, such as a phosphate, a sulfate (e.g. sodium dodecylsulfate), a sulfonate (e.g. sodium dodecylbenzenesulfonate or sodium dioctyl sulfosuccinate), a carboxylate, or an anionic gemini surfactant.

In some embodiments, the ionic surfactant may be a cationic surfactant. In some embodiments, the cationic surfactant may be cetyltrimethylammonium chloride.

In embodiments, the ionic surfactant may have a critical micelle concentration. Thus, step "c" of removing the solvent may comprise a stage where a concentration of the ionic surfactant in the precursor aqueous solution exceeds the critical micelle concentration. The formation of micelles by reaching the critical micelle concentration of the ionic surfactant, particularly when combined with later removing the ionic surfactant from the dielectric material (cf. infra), can aid in the formation of a low-k material through the formation of a porous material.

In embodiments, providing the precursor aqueous solution may comprise first forming the precursor aqueous solution. In an embodiment, this may be performed by: (i) forming a matrix solution by mixing a part of the solvent, the catalyst, the dielectric material precursor, and a solvent (comprised in the solvent of the precursor solution); (ii) forming a template solution by mixing the ionic surfactant and a solvent (comprised in the solvent of the precursor solution); and (iii) mixing the matrix solution with the template solution.

At least one and/or both of the matrix solution and the template solution can be aqueous solutions.

In embodiments, the amount of solvent in the matrix solution may be from 61 to 75 vol %, or from 63 to 72 vol %, or from 65 to 70 vol %.

In embodiments, the amount of water in the solvent of the matrix solution may be from 15 to 30 vol %, or from 19 to 25 vol %, or from 20 to 24 vol %, or from 21 to 23 vol %.

In embodiments, the amount of low boiling point solvent (bp<100° C.) in the solvent of the matrix solution may be at most 85%, or at most 80%, or at most 79%.

In embodiments, a high boiling point solvent (bp>100° C.) may be present in the matrix solution.

In embodiments, the amount of solvent in the template solution may be from 96 to 99.5 vol %, or from 97 to 99 vol %, or from 98 to 99 vol %.

In embodiments, the amount of water in the solvent of the template solution may be from 2 to 7 vol %, or from 3 to 6 vol %, or from 4 to 5.5 vol %, or from 4.3 to 5.1 vol %.

In embodiments, the amount of high boiling point solvent in the solvent of the template solution may be at least 93 vol %, or at least 94 vol %, or at least 95 vol %. Examples of high boiling point solvents are esters such as 1-methoxy-2-propanol and ethers such as dipropylene glycol methyl ether.

In embodiments, a low boiling point solvent may be present in the matrix solution.

In embodiments, when a strong acid is used as the catalyst, the normality of the matrix solution may be from $6.10^{-5}$N to $2.10^{-1}$ N, or from $6.10^{-5}$N to $10^{-2}$N, or from $6.10^{-5}$N to $3.10^{-3}$N, or from $6.10^{-5}$ N to $3.10^{-4}$N, or from $6.10^{-5}$ N to $2.10^{-4}$ N. For instance, in the examples described herein, a selectivity can be observed for a concentration in HCl in the matrix solution of $1.5.10^{-4}$. When a weak acid is used, its concentration can be adapted to arrive at a pH equivalent to the pH arrived at for the concentration values in strong acid given above.

Step (i) of forming the precursor aqueous solution may be performed above room temperature, for instance by refluxing the mixture. Step (i) may also performed by heating up the mixture for at least 30 min, e.g., for a duration between 30 min and 2 h. Step (ii) of forming the precursor aqueous solution can be performed at room temperature but can also be performed above room temperature. Step (iii) of forming the precursor aqueous solution can be performed with the matrix solution and the template solution being at room temperature.

In embodiments, step "b" (shown in FIG. 7 as step 704) of providing the precursor aqueous solution on the substrate may comprise spin coating or dip coating the aqueous solution on the substrate. An increased selectivity can be achieved by spin coating. Spin coating may, for example, be performed at a speed of from 100 to 10000 rpm, or from 200 to 3000 rpm, or from 250 to 1500 rpm, or from 300 to 1000 rpm, such as e.g., 500 rpm. The spinning time may for example be from 10 s to 300 s, or from 30 s to 120 s, or from 40 s to 80 s, such as e.g., 60 s.

In embodiments, step "c" (shown in FIG. 7 as step 706) of removing the solvent may be performed by leaving the aqueous solution at room temperature until the solvent is evaporated.

In embodiments, step "c" of removing the solvent may be performed by heating the aqueous solution above room temperature until the solvent is evaporated. Heating the aqueous solution above room temperature until the solvent is evaporated may comprise heating the solvent at a temperature at or above 100° C., such as up to 200° C.

In some embodiments, step "c" of removing the solvent may comprise spinning (e.g., spin coating) the substrate. Spinning the substrate after providing the precursor aqueous solution thereon, thereby at least partially removing the solvent, can aid in the selectivity of the dielectric formation. At least partially removing the solvent by spinning the substrate can improve the preferential accumulation of the remaining precursor aqueous solution onto the first area, more so than an entirely static evaporation.

In embodiment, step "c" of removing the solvent may be performed by heating the aqueous solution to a temperature sufficient to simultaneously decompose the surfactant. In that case, step "c" and step "c1" (see below) can be simultaneous. This is the case in embodiments where step "c" of removing the solvent comprises heating the precursor aqueous solution at a temperature of 300° C. to 600° C., or 350° C. to 450° C., such as 400° C. Heating the precursor aqueous solution may be performed under an inert atmosphere, such as $N_2$, and/or for a period of at least 1 hour, or at least 2 hours.

In some embodiments, step "c" of removing the solvent may comprise: (i) partially removing the solvent by spinning (e.g., spin coating) the substrate, and (ii) subsequently heating the precursor aqueous solution at a temperature of 100° C. to 600° C., or 350° C. to 450° C., such as 400° C.

In embodiments, the method may further comprise a step "c1", after step c or simultaneously with step c, of: removing the ionic surfactant from the dielectric material, thereby forming a low-k dielectric material.

Removing the ionic surfactant may, for example, be achieved by heating the dielectric material to a temperature high enough for the ionic surfactant to be decomposed, which may also be referred to as burning out the ionic surfactant. Step "c1" may comprise heating the precursor aqueous solution at a temperature of 300° C. to 600° C., or 350° C. to 450° C., such as 400° C.

In embodiments, the dielectric material may define one or more sidewalls of at least one opening therein, the opening exposing at least part of the second area. In other words, the dielectric material may have at least one opening therein, where the at least one opening has sidewalls formed of the dielectric material, and where the at least one opening exposes at least part of the second area. The opening may, for example, be a via, such as a via for forming an electrical connection in a semiconductor device.

In embodiments, when the dielectric material defines one or more sidewalls of at least one opening (e.g., a trench) therein, the opening exposing at least part of the second area, when the second area is made of a metal, the method may further comprise a step "d" (shown in FIG. 7 as step 708), after step "c" or, if a step "c1" is present, after step "c1", of: forming an electrical contact in the opening.

This further step is indicated as an optional step in FIG. 7. In embodiments, step "d" may comprise: covering at least the second area with a hard mask (e.g. SiCN), depositing a low-k dielectric above the hard mask, forming a via above a portion of the opening through the low-k and the hard mask by lithography, and filling the via with a conductive material.

The electrical contact could also be referred to as a self-aligned electrical contact.

In a second aspect, the present disclosure relates to a semiconductor structure, comprising: a substrate comprising a top surface, the top surface comprising a first area and a second area, the second area having a hydrophilicity characterized by a water contact angle of less than 40° and the first area having a hydrophilicity characterized by a water contact angle of 45° or more; and a dielectric material present at least on the first area.

The semiconductor structure may typically be an intermediate in the formation of a semiconductor device, such as a device comprising a plurality of transistors and interconnects.

In some embodiments, the dielectric material may be a low-k material. In embodiments, the low-k material may comprise a silica, such as a sol-gel derived surfactant-templated silica, or an organosilica.

In embodiments, the second area may be made of a material having a hydrophilicity characterized by a water contact angle of less than 40°.

In embodiments, any feature of the second aspect may independently be as correspondingly described for the first aspect.

The disclosure will now be described by a detailed description of several embodiments of the disclosure. It is clear that other embodiments of the disclosure can be configured according to the knowledge of the person skilled in the art without departing from the true technical teaching of the invention, the invention being limited only by the terms of the appended claims.

I. EXAMPLES a. Example 1

Formation of the Precursor Aqueous Solution

A matrix solution can be made by stirring and refluxing 2 ml of ethanol (solvent), 0.56 ml of 0.02M HCl (catalyst) and 1.2 ml of methyltriethoxysilane (dielectric material precursor) in a 100 ml round-bottom flask for 1 h at 60° C. Subsequently, the solution can be cooled down to room temperature.

A template solution can be made by mixing 0.5 ml cetyltrimethylammonium chloride solution (ionic surfactant; 25 wt % in $H_2O$) with 7.6 ml 1-methoxy-2-propanol (solvent) and stirring at room temperature.

Finally, the precursor aqueous solution can be formed by adding the template solution to the matrix solution and stirring for 15 min at room temperature.

b. Example 2

Formation of a Dielectric Material on Surface Engineered Substrates i. Example 2a : Formation of a Dielectric Material on a Si Substrate Having a more Hydrophilic area and a less Hydrophilic area The precursor aqueous solution can be spin coated on a first and a second area at 500 rpm for 60 seconds and subsequently annealed at 400° C. for 2 hours in a $N_2$ atmosphere.

The second area can be a cleaned Si wafer surface comprising a native $SiO_2$ layer of a few nm; making the surface more hydrophilic (e.g., $\theta<40°$.

The first area can be a Si wafer surface treated with a 5% HF solution, thereby removing the native oxide and making the surface H-terminated; making the surface less hydrophilic (e.g., $\theta=80°$).

We now refer to FIG. 1 that illustrates a Fourier transformed infrared spectra (FTIR) 100 of the first (represented by a solid line 102) and second (represented by a dashed line 104) area after spin coating and annealing. It can be observed that the spectrum of the hydrophilic second area shows an essentially flat curve. Conversely, the spectrum of the hydrophobic first area features well-resolved peaks which can be attributed to the C—H, Si—$CH_3$ and Si—O—Si bonds present in the dielectric material. As such, there is a clear indication that the dielectric material is formed on the more hydrophobic surface, while none is formed on the more hydrophilic surface.

Figure 2:
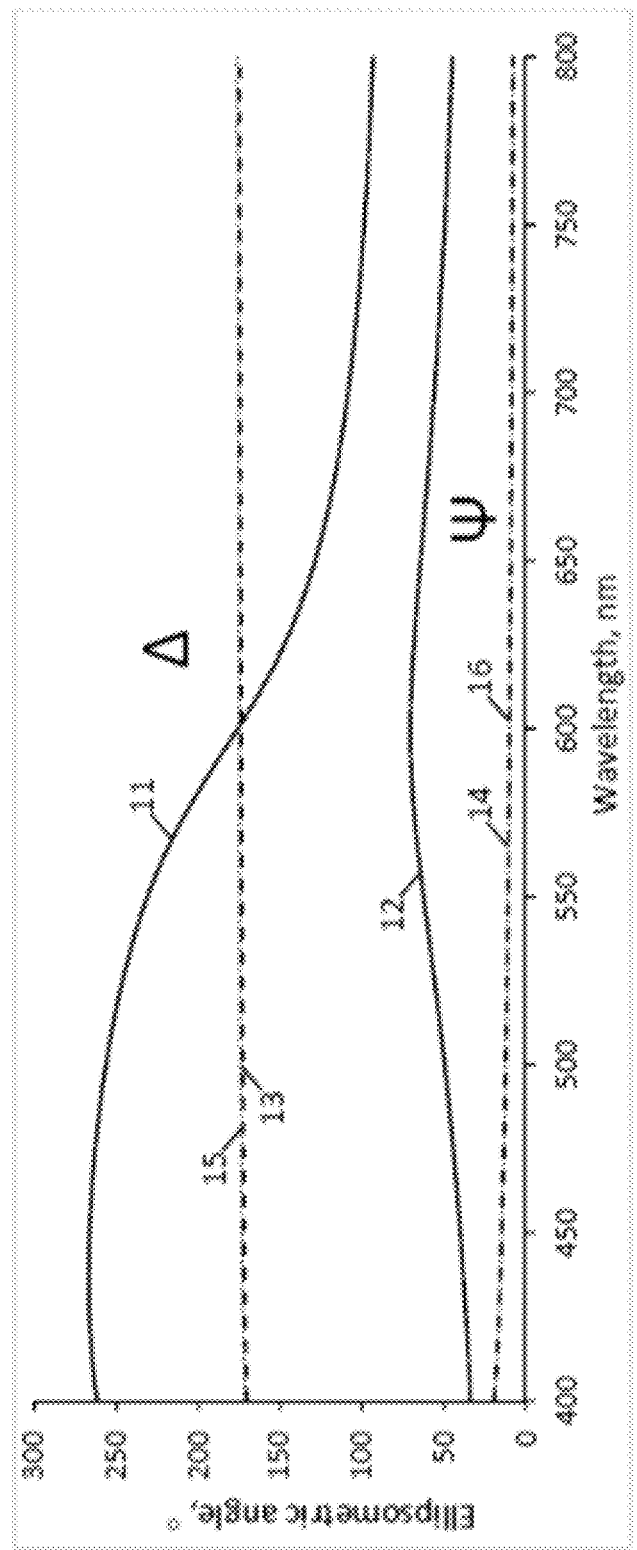
FIG. 2 and FIG. 3 each show ellipsometric spectra, in accordance with exemplary embodiments.

We now refer to FIG. 2 that illustrates an Ellipsometric spectra of the first (represented by solid lines 11, 12) and second (represented by dashed lines 13, 14) area, both after spin coating and annealing, and a Si reference (represented by dotted lines 15, 16) sample. It can be observed that the spectrum of the hydrophilic second area and the Si reference sample overlap, both for the amplitude ratio Ψ (bottom) and the phase difference Δ (top). Conversely, the spectrum of the hydrophobic first area is distinctly different from that of the Si reference sample. As such, there is again a clear indication that the dielectric material is formed on the more hydrophobic surface, while none is formed on the more hydrophilic surface.

ii. Example 2b : Formation of a Dielectric Material on a Cu Substrate having a more Hydrophilic area and a less Hydrophilic area The precursor aqueous solution can be spin coated on a first and a second area at 500 rpm for 60 seconds and subsequently annealed at 400° C. for 2 hours in a $N_2$ atmosphere.

The second area can be a Cu layer after a chemical mechanical planarization and cleaning of the Cu, thereby making the surface more hydrophilic (e.g., $\theta=20°$). It is noteworthy that the water contact angle before cleaning is 45° and that the dielectric forms on that surface. A water contact angle of 45° may not therefore be sufficient to prevent the formation of the dielectric.

The first area can be a Cu layer after a chemical mechanical planarization and a subsequent silylation of the Cu, thereby making the surface more hydrophobic (e.g., $\theta=120°$).

Figure 3:
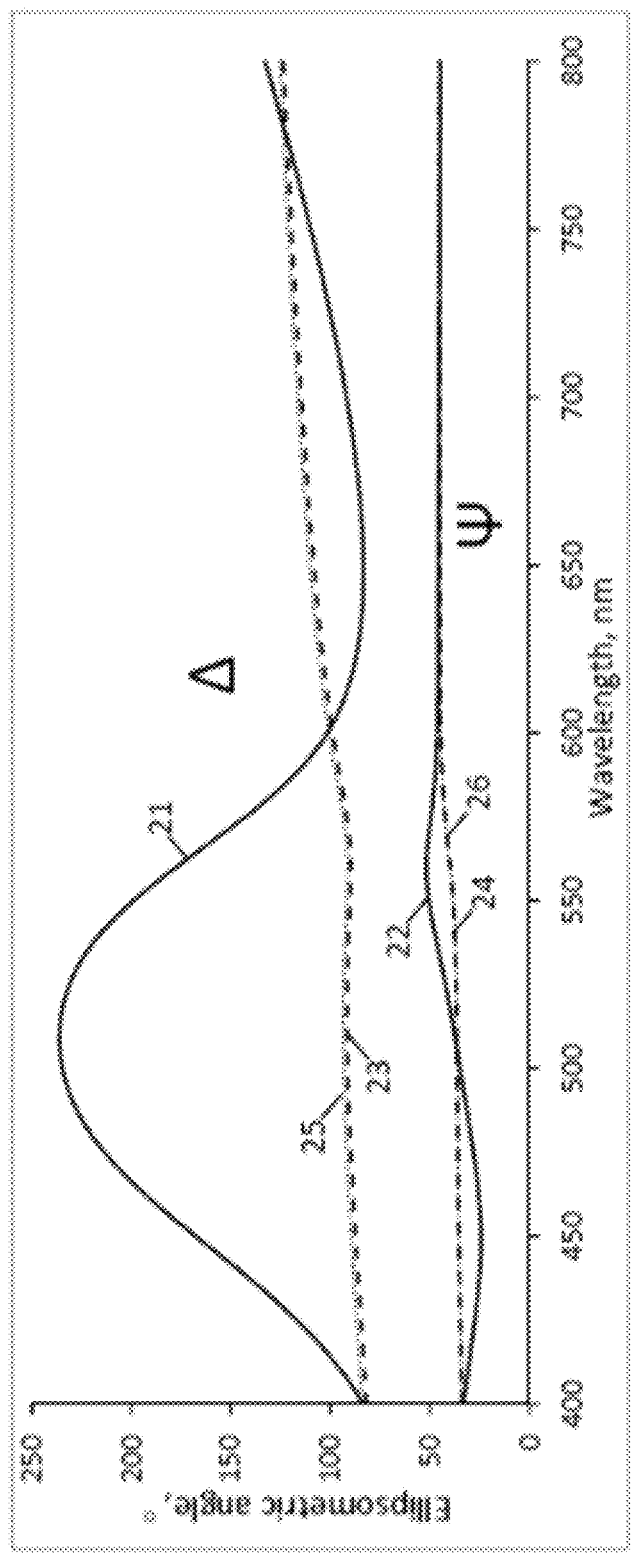

We now refer to FIG. 3 that illustrates an Ellipsometric spectra of the first (represented by solid 21, 22) and second (represented by dashed 23, 24) surface, both after spin coating and annealing, and a Cu reference (represented by dotted lines 25, 26) sample. It can be observed that the spectrum of the hydrophilic second surface and the Si reference sample overlap, both for the amplitude ratio Ψ (bottom) and the phase difference Δ (top). Conversely, the spectrum of the hydrophobic first surface is distinctly different from that of the Si reference sample. As such, also in the case of a Cu substrate, a clear indication can be found that the dielectric material is formed on the more hydrophobic surface, while none is formed on the more hydrophilic surface.

iii. Comparative Example 1: Use of Non-ionic Surfactants

Examples 1 and 2 can be repeated with various non-ionic surfactants. However, selectivity could not be achieved using non-ionic surfactants.

c. Example 3

Formation of a low-k Dielectric Material on a Selective area of a Substrate

Figure 5A:
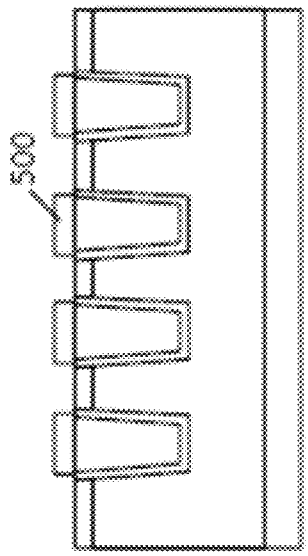
FIGS. 5a, 5b, 5c, 5d, 5e show a schematic representation of different stages in an area selective deposition of a metal oxide as preparation to a subsequent formation of a via, in accordance with an exemplary embodiment.

We now refer to FIGS. 4a-d that illustrate a precursor aqueous solution (300) that is spin coated on a substrate as in Example 2. The substrate comprises both a first area (110) and a second area (200), the first area being less hydrophilic than the second area (FIG. 4a). At this stage, the precursor aqueous solution (300) can in some embodiments already leave the second area and only cover the first area (not depicted). This selection is, however, more frequent at a later stage. Subsequently, the solvent can be partially removed (e.g., during the spin coating), thereby reaching the critical micelle concentration of the ionic surfactant (310) such that micelles (311) are formed (FIG. 4b). Already at this stage, the precursor aqueous solution (300) can in some embodiments leave the second area and only cover the first area (as depicted in FIG. 4b). This selection can however also occur at a later stage. Further removal (e.g., evaporation) of the solvent leads to the formation of the dielectric material (400), selectively on the first area (FIG. 4c). It is typically at the latest at this stage that the precursor aqueous solution (300) leaves the second area and only covers the first area. Finally, the ionic surfactant (310) can be burned out to form a porous (312) dielectric material (400) (FIG. 4d).

i. Comparative Example 2: Area Selective Deposition of a Metal Oxide and Formation of a via We now refer to FIG. 5a that illustrates a substrate provided comprising a first (110) and a second (112) low-k dielectric layer on a SiO$_2$ layer (120). Trenches can be made that penetrate through the first low-k dielectric layer (110) and into the second low-k dielectric layer (112). These trenches can be filled with a barrier layer (e.g., a MnN and/or TaN layer 210) and a Cu fill metal (200). After filling the trenches with copper, a chemical-mechanical polishing can be performed and the Cu surface can be cleaned. The top surface of the substrate can thus comprise a low-k dielectric first area (110) and a Cu second area (200).

Figure 5B:
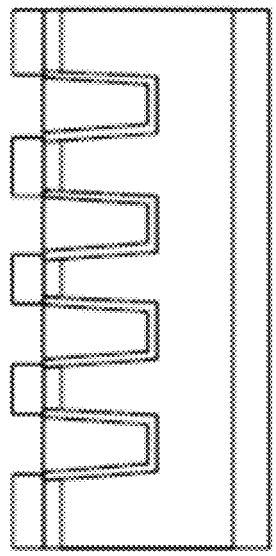

We now refer to FIG. 5b that illustrates a self-assembling monolayer (SAM 500), such as 1-octadecanethiol, deposited onto the Cu second area (200).

Figure 5C:
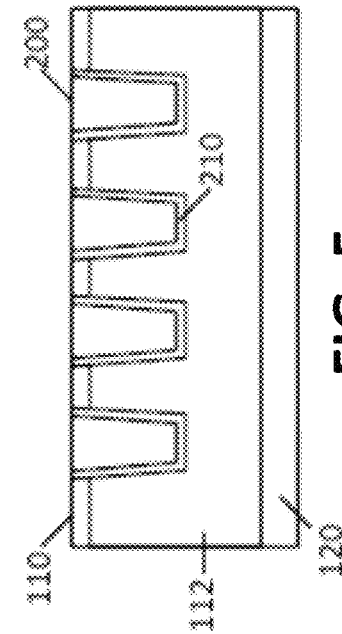

We now refer to FIG. 5c that illustrates a metal oxide (600) selectively deposited onto the area not covered by the SAM (500), i.e., onto the low-k dielectric first area (110), using atomic layer deposition (ALD).

Figure 5D:
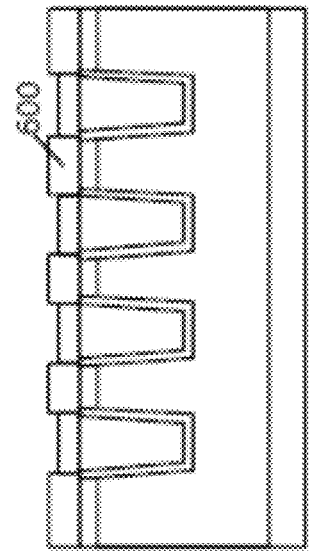

We now refer to FIG. 5d. The SAM (500) can be removed, selectively with respect to the metal oxide (600).

Figure 5E:
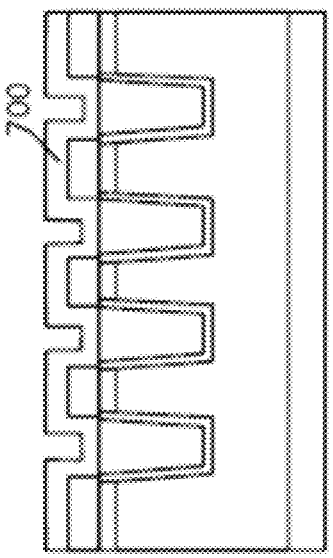

We now refer to FIG. 5e. A layer of SiCN (700) can be deposited over the metal oxide (600) and Cu second area (200).

d. Example 4

Area Selective Formation of a Dielectric Material and Formation of a via in Accordance with an Embodiment of the Present Disclosure We now refer to FIG. 6a that illustrates a substrate such as described in the comparative example. Optionally, the hydrophilicity of the low-k dielectric first area (110) and/or the Cu second area (200) can be further tuned through surface engineering. For example, a hydrophobic silane, such as a trialkoxymethylsilane, may be reacted to the low-k dielectric first area (110), or a hydrophilic thiol may be self-assembled onto the Cu second area (200), or the Cu second area (200) may be reduced with a hydrogen plasma or an acid such as citric acid. These modifications are however optional.

We now refer to FIG. 6b that illustrates a precursor aqueous solution according to the present disclosure spin coated onto the substrate and subsequently annealed, thereby area selectively forming a dielectric material (400), such as a low-k dielectric, onto the low-k dielectric first area (100).

We now refer to FIG. 6c that illustrates a layer of SiCN deposited over the metal oxide and the Cu second area (200). Further steps (not depicted) may include depositing a low-k dielectric above the SiCN, forming a via above a portion of the opening through the low-k and the SiCN by lithography, and filling the via with a conductive material to form an interconnect.

e. Example 5

Use of Other Precursors

Example 1 can be repeated with each of the following precursors: bis(triethoxysilyl)methane, bis(triethoxysilyl)ethane, 1,1,3,3,5,5-hexaethoxy-1,3,5-trisilacyclohexane and tetraethyl orthosilicate instead of triethoxymethylsilane. Similar selectivity can be achieved when these solutions are used in Example 2.

f. Example 6

Use of Other Ionic Surfactants

Example 1 can be repeated with each of the following surfactants instead of cetyltrimethylammonium chloride: cetyltrimethylammonium bromide, domiphen bromide, octadecyltrimethylammonium chloride, cetylpyridinium chloride, N-dodecyl pyridinium chloride sodium dodecylsulfate, sodium dodecylbenzenesulfonate and sodium dioctyl sulfosuccinate. Similar selectivity is achieved when these solutions are used in Example 2.

g. Example 7

Influence of the Spinning Speed

Figure 8:
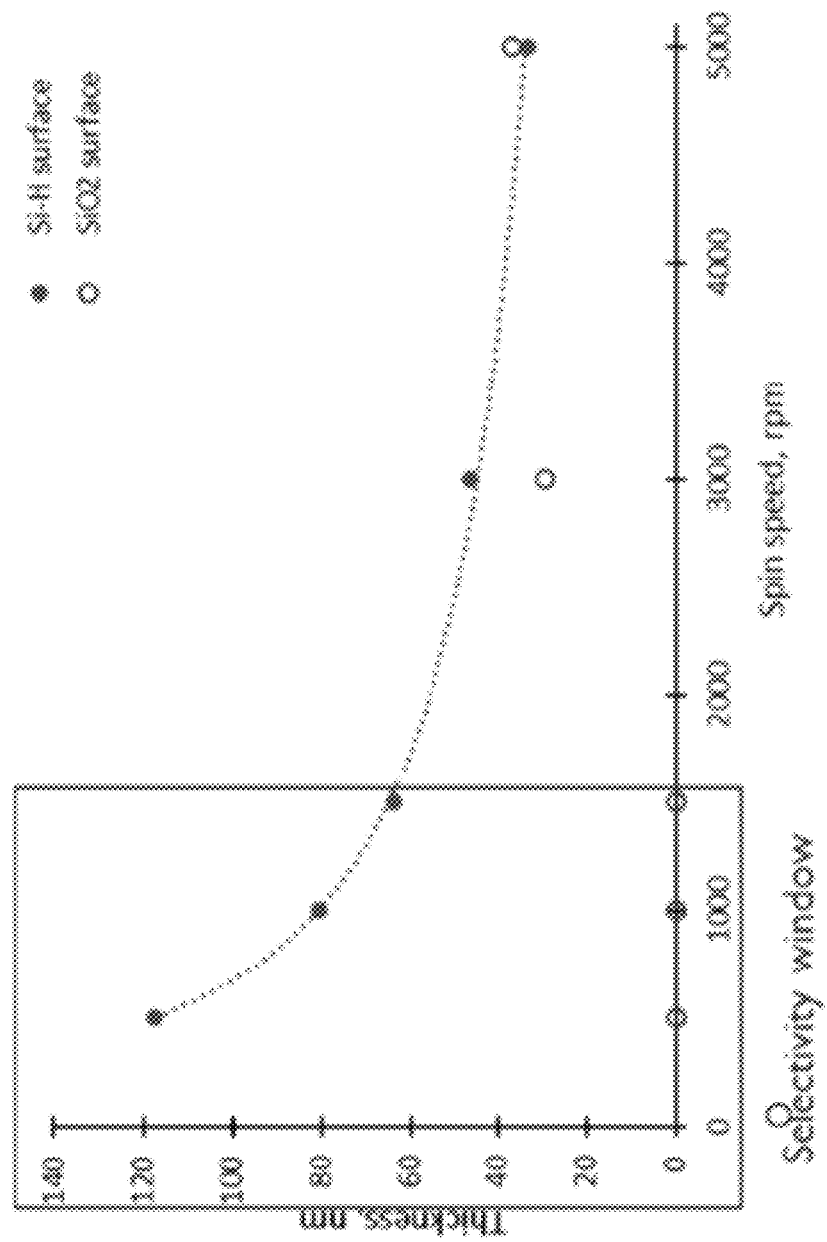
FIG. 8 shows a graph of the layer thickness obtained as a function of spin speed for two different surfaces, in accordance with an exemplary embodiment.

We now refer to FIG. 8. Example 2a can be repeated at different spinning speeds ranging from 500 to 5000 rpm. Spinning speeds of 500, 1000, and 1500 rpm can give the best selectivity.

h. Example 8

Influence of the Acidity of the Precursor Solution

Figure 9:
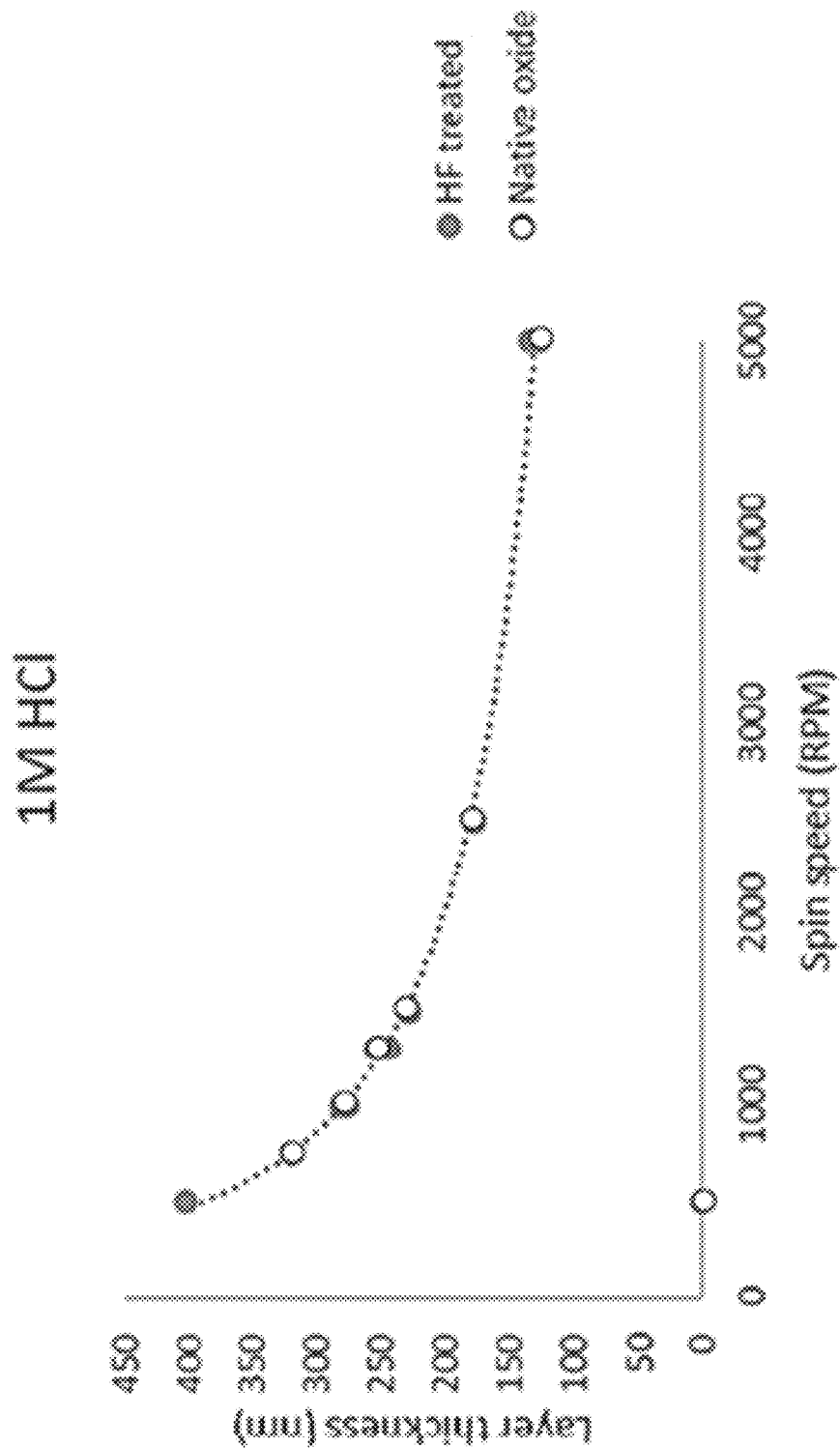
FIG. 9 shows a graph of the layer thickness obtained as a function of spin speed for two different surfaces when the pH is decreased, in accordance with an exemplary embodiment.

We now refer to FIG. 9. Example 2a can be repeated at a higher acid concentration and different spinning speeds. To achieve selectivity at that higher acid concentration, a lower spinning speed of 500 rpm can be used.

i. Example 9

Figure 10:
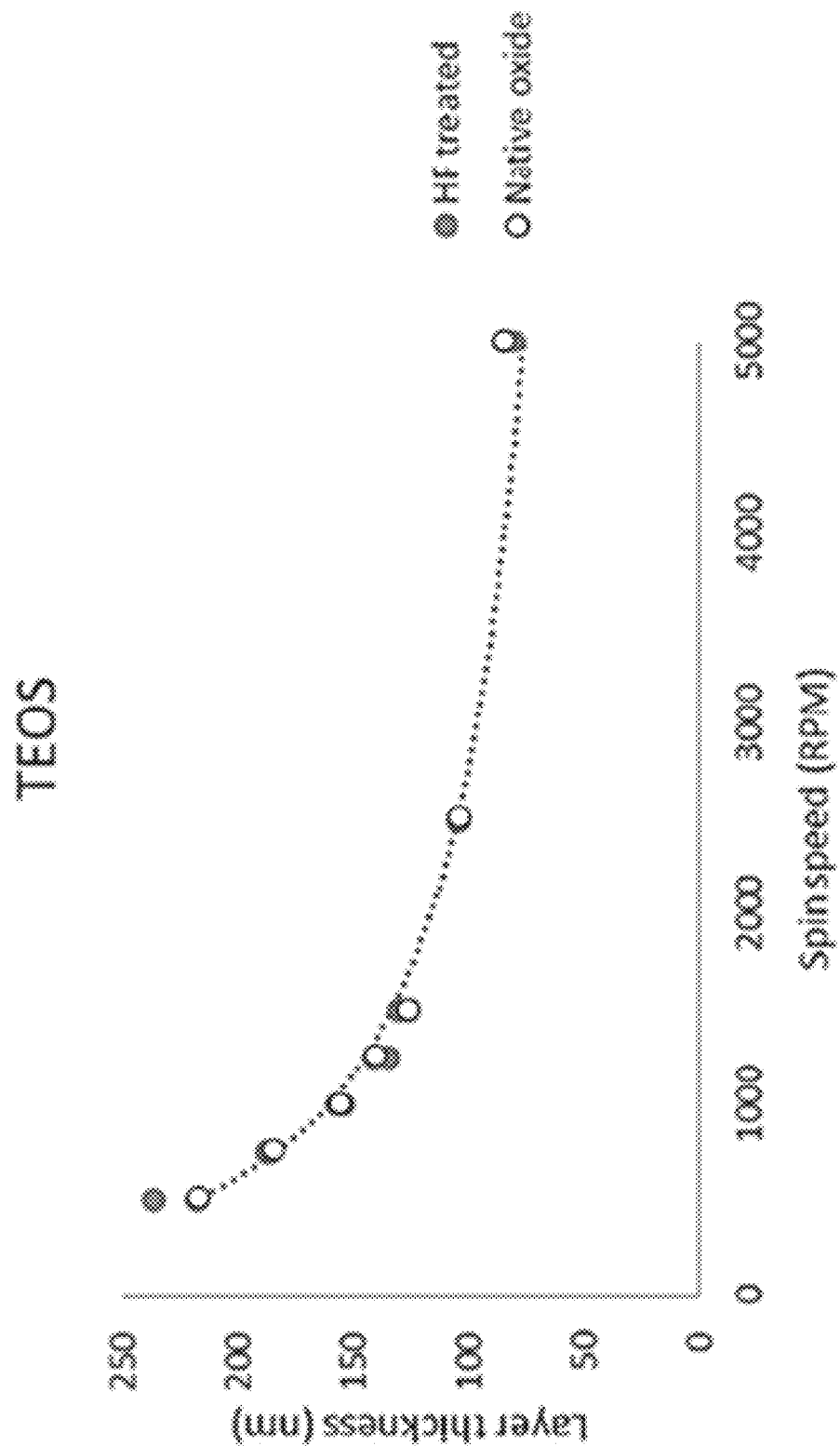
FIG. 10 shows a graph of the layer thickness obtained as a function of spin speed for two different surfaces when TEOS is used as a dielectric material precursor, in accordance with an exemplary embodiment.

Influence of the Nature of the Precursor and of the Acidity of the Precursor Solution We now refer to FIG. 10. Example 2a can be repeated with TEOS (tetraethyl orthosilicate) instead of MTES (triethoxymethylsilane). However, no selectivity can be achieved. At a lower acid concentration, some selectivity can be achieved at very low spin speed (not shown).

Figure 11:
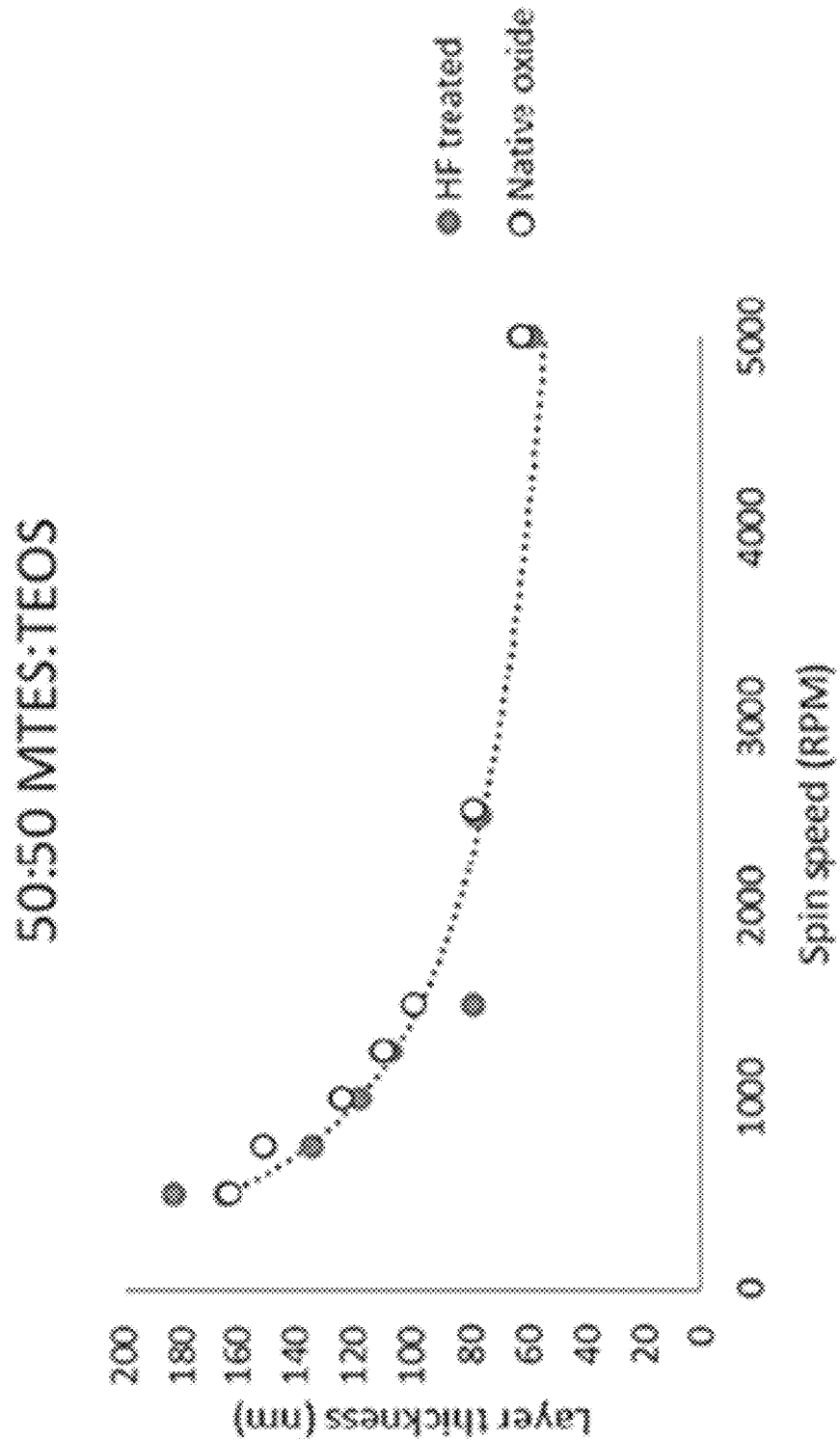
FIG. 11 shows a graph of the layer thickness obtained as a function of spin speed for two different surfaces when a 50:50 mol % mixture MTES/TEOS is used as a dielectric material precursor, in accordance with an exemplary embodiment.

We now refer to FIG. 11. Example 2a can be repeated with a mixture MTES/TEOS 50/50 mol/mol. No selectivity can be achieved.

Figure 12:
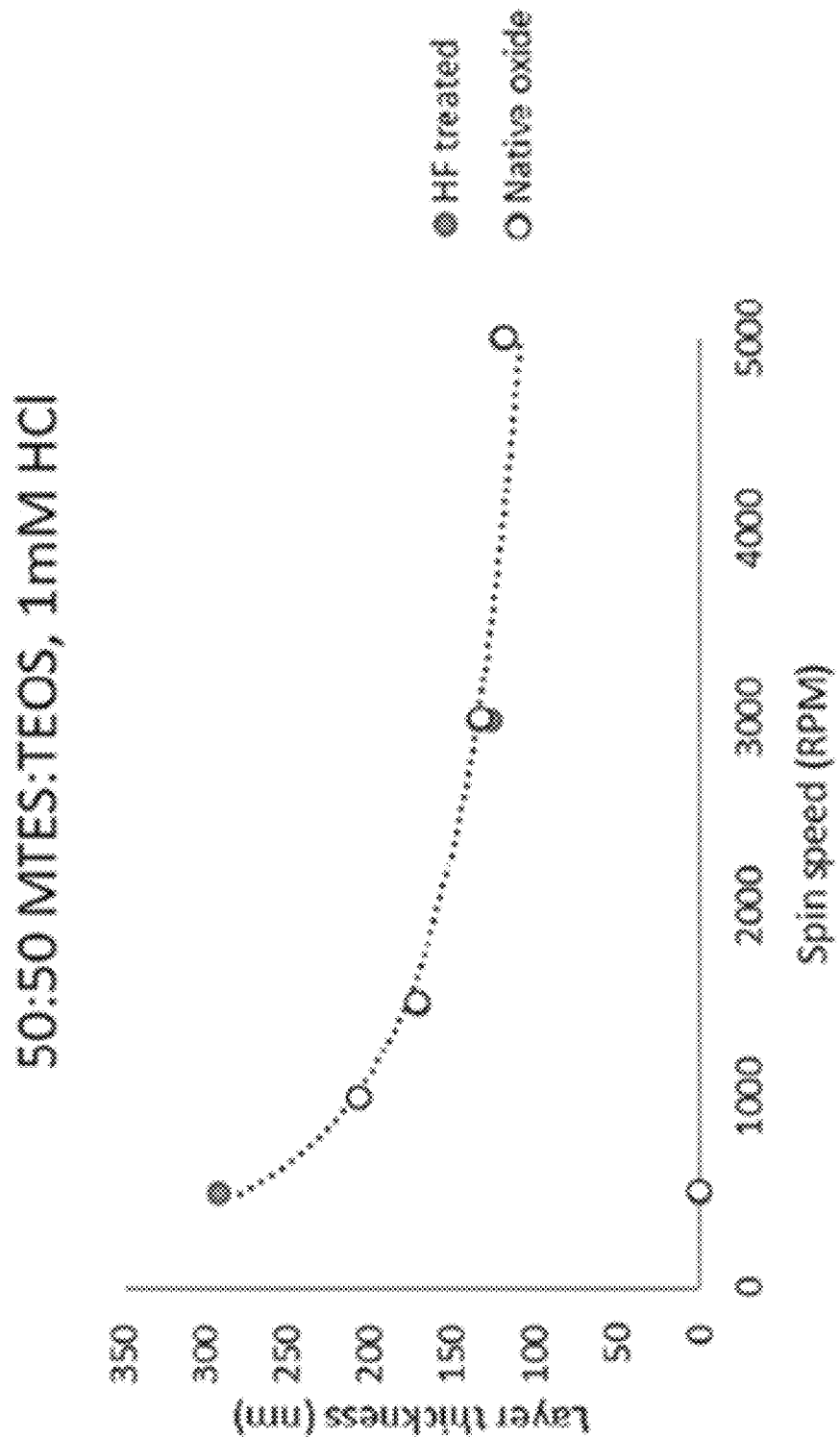
FIG. 12 shows a graph of the layer thickness obtained as a function of spin speed for two different surfaces when a 50:50 mol % mixture MTES/TEOS is used as a dielectric material precursor and when the pH is increased, in accordance with an exemplary embodiment.

We now refer to FIG. 12. Example 2a can be repeated with a mixture MTES/TEOS 50/50 mol/mol at a lower acid concentration of 1 mM. Selectivity can be achieved at 500 rpm.

It is to be understood that although certain embodiments, specific constructions and configurations, as well as materials, have been discussed herein for devices according to the present invention, various changes or modifications in form and detail may be made without departing from the scope and technical teachings of the present disclosure. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A method for forming a dielectric material selectively on a first area of a top surface of a substrate, comprising:
providing the substrate comprising the top surface, the top surface comprising the first area and a second area, the first area having a hydrophilicity characterized by a water contact angle of at least 45° and the second area having a hydrophilicity characterized by a water contact angle of less than 40°;
providing a precursor aqueous solution on the substrate, the precursor aqueous solution comprising:
(i) a solvent;
(ii) a dielectric material precursor;
(iii) a catalyst for forming a dielectric material from the dielectric material precursor, wherein the dielectric material defines one or more sidewalk of at least one opening therein, the at least one opening exposing at least part of the second area; and
(iv) an ionic surfactant;
removing the solvent; and
forming an electrical contact in the at least one opening on at east part of the exposed second area.

2. The method of claim 1, wherein the dielectric material comprises silica or an organosilica.

3. The method of claim 1, wherein the dielectric material is a first dielectric material, and wherein the first area comprises a second dielectric material.

4. The method of claim 1, wherein the second area comprises a metal.

5. The method of claim 4, further comprising:
reducing at least a top surface of the metal.

6. The method of claim 1, wherein the second area comprises a self-assembled monolayer having a polar end-group.

7. The method of claim 1, wherein the dielectric material precursor is selected from the group consisting of: triethoxymethylsilane, bis(triethoxysilyl)methane, bis(triethoxysilyl)ethane, 1,1,3,3,5,5-hexaethoxy-1,3,5-trisilacyclohexane, and tetraethyl orthosilicate.

8. The method of claim 1, wherein the ionic surfactant is a cationic surfactant.

9. The method of claim 8, wherein the ionic surfactant is cetyltrimethylammonium chloride.

10. The method of claim 1, wherein providing the precursor aqueous solution on the substrate comprises spin coating the aqueous solution on the substrate.

11. The method of claim 1, further comprising:
removing the ionic surfactant from the dielectric material, thereby forming a low-k dielectric material.

12. The method of claim 1, wherein removing the solvent comprises heating the provided precursor aqueous solution at a temperature between 100° C. to 600° C.

13. The method of claim 1, wherein removing the solvent comprises heating the provided precursor aqueous solution at a temperature between 350° C. to 450° C.

14. The method of claim 1, wherein providing the substrate comprising the top surface comprises surface engineering at least one of the first and the second area such that the first area has the water contact angle of at least 45° and the second area has the water contact angle of less than 40°.

15. The method of claim 1, wherein providing the precursor aqueous solution comprises forming the precursor aqueous solution, wherein forming the precursor aqueous solution comprises:
(i) forming a matrix solution by mixing a part of the solvent, the catalyst, the dielectric material precursor, and a first solvent;
(ii) forming a template solution by mixing the ionic surfactant and a second solvent; and
(iii) mixing the matrix solution with the template solution.

16. A semiconductor structure, comprising:
a substrate comprising a top surface, the top surface comprising a first area and a second area, the second area having a hydrophilicity characterized by a water contact angle of less than 40° and the first area having a hydrophilicity characterized by a water contact angle of at least 45°;
a dielectric material present at least on the first area, wherein the dielectric material defines one or more sidewalls of at least one opening therein, the at least one opening exposing at least part of the second area; and
an electrical contact in the at least one opening on at least part of the exposed second area.

17. The semiconductor structure of claim 16, wherein the dielectric material is a low-k material.

18. The semiconductor structure of claim 16, wherein the dielectric material is present only on the first area.

19. The semiconductor structure of claim 16, wherein the dielectric material comprises silica or an organosilica.

20. The semiconductor structure of claim 16, wherein the dielectric material is formed by providing a precursor aqueous solution on the substrate, the precursor aqueous solution comprising:
(i) a solvent;
(ii) a dielectric material precursor;
(iii) a catalyst for forming a dielectric material from the dielectric material precursor; and
(iv) an ionic surfactant.

* * * * *